United States Patent
Cheng et al.

(10) Patent No.: US 9,707,738 B1
(45) Date of Patent: Jul. 18, 2017

(54) COPPER FOIL AND METHODS OF USE

(71) Applicant: Chang Chun Petrochemical Co., Ltd., Taipei (TW)

(72) Inventors: Kuei-Sen Cheng, Taipei (TW); Shih-Cheng Tseng, Taipei (TW); Tsang-Jin Juo, Taipei (TW)

(73) Assignee: Chang Chun Petrochemical Co., Ltd., Taipei (TW)

( * ) Notice: Subject to any disclaimer, the term of this patent is extended or adjusted under 35 U.S.C. 154(b) by 0 days.

(21) Appl. No.: 14/995,911

(22) Filed: Jan. 14, 2016

(51) Int. Cl.
| | |
|---|---|
| *B32B 15/01* | (2006.01) |
| *B32B 37/10* | (2006.01) |
| *B32B 37/16* | (2006.01) |
| *B32B 37/12* | (2006.01) |
| *H01C 7/00* | (2006.01) |
| *C25D 7/06* | (2006.01) |

(52) U.S. Cl.
CPC .............. *B32B 15/01* (2013.01); *B32B 37/10* (2013.01); *B32B 37/1284* (2013.01); *B32B 37/16* (2013.01); *C25D 7/0614* (2013.01); *H01C 7/008* (2013.01); *B32B 2311/12* (2013.01); *B32B 2311/22* (2013.01); *B32B 2457/00* (2013.01); *H05K 2203/0307* (2013.01)

(58) Field of Classification Search
None
See application file for complete search history.

(56) References Cited

U.S. PATENT DOCUMENTS

| | | | |
|---|---|---|---|
| 4,469,567 A | * | 9/1984 | Torday .................. H05K 3/384 205/50 |
| 4,537,837 A | * | 8/1985 | Gunn ..................... C25D 3/565 428/621 |
| 4,800,253 A | | 1/1989 | Kleiner et al. |
| 4,935,310 A | | 6/1990 | Nakatsugawa |
| 5,454,926 A | | 10/1995 | Clouser et al. |
| 5,792,333 A | | 8/1998 | Oguro et al. |
| 5,908,542 A | | 6/1999 | Lee et al. |
| 6,117,300 A | | 9/2000 | Carbin et al. |

(Continued)

FOREIGN PATENT DOCUMENTS

JP    2008184633 A    8/2008

OTHER PUBLICATIONS

Rogers Corporation, "Copper Foils for High Frequency Materials", 2015 Retrieved from: https://www.rogerscorp.com/documents/749/acs/Copper-Foils-for-High-Frequency-Circuit-Materials.pdf.

*Primary Examiner* — David Sample
*Assistant Examiner* — Nicholas W Jordan
(74) *Attorney, Agent, or Firm* — Polsinelli PC

(57) ABSTRACT

A copper foil having a matte side with nickel plated thereon in an amount of nickel in the range of 100,000-300,000 µs/dm². The plated copper foils have particular utility in Positive Temperature Coefficient (PTC) devices. The plated copper foils have a surface hardness of from 50 to 200, a tensile strength greater than 45 kg/mm² and a shiny side surface roughness (Rz) not exceeding 2.0 µm. The surface roughness of the matte side of the copper foil is in the range of 6 to 10 µm. Copper nodules are present on the matte side of the copper foil between the copper foil and the nickel plating. Methods of producing the copper foil and PTC devices incorporating the copper foil are described.

19 Claims, 7 Drawing Sheets

(56) References Cited

U.S. PATENT DOCUMENTS

| | | | |
|---|---|---|---|
| 6,231,742 B1* | 5/2001 | Sano | C25D 3/38 428/606 |
| 6,291,081 B1 | 9/2001 | Kurabe et al. | |
| 6,570,483 B1 | 5/2003 | Chandler et al. | |
| 6,579,568 B2 | 6/2003 | Fujiwara et al. | |
| 6,610,417 B2* | 8/2003 | Andresakis | H05K 3/384 428/607 |
| 6,833,198 B2 | 12/2004 | Sakamoto et al. | |
| 6,902,824 B2 | 6/2005 | Yamamoto et al. | |
| 6,965,293 B2 | 11/2005 | Choi et al. | |
| 6,969,557 B2* | 11/2005 | Matsuda | H05K 3/384 428/612 |
| 6,984,456 B2 | 1/2006 | Okada et al. | |
| 6,987,440 B2 | 1/2006 | Becker et al. | |
| 6,989,199 B2* | 1/2006 | Yamamoto | H05K 3/384 428/612 |
| 7,175,920 B2 | 2/2007 | Suzuki et al. | |
| 7,190,016 B2 | 3/2007 | Cahalen et al. | |
| 7,192,654 B2 | 3/2007 | Andresakis et al. | |
| 7,691,487 B2 | 4/2010 | Nagatani | |
| 7,862,900 B2 | 1/2011 | Andresakis et al. | |
| 8,187,723 B2 | 5/2012 | Matsunaga | |
| 9,078,353 B2 | 7/2015 | Tzou et al. | |
| 9,138,964 B2 | 9/2015 | Obata et al. | |
| 2002/0005249 A1* | 1/2002 | Kuwako | H05K 3/4652 156/293 |
| 2002/0064019 A1* | 5/2002 | Dobashi | C25D 1/04 361/302 |
| 2003/0148136 A1 | 8/2003 | Yamamoto et al. | |
| 2004/0104802 A1* | 6/2004 | Becker | H01C 7/027 338/22 R |
| 2004/0154930 A1 | 8/2004 | Shinozaki | |
| 2004/0191560 A1* | 9/2004 | Matsuda | C25D 5/16 428/612 |
| 2007/0237976 A1 | 10/2007 | Okada et al. | |
| 2012/0276412 A1 | 11/2012 | Miki | |
| 2013/0071755 A1 | 3/2013 | Oguro | |
| 2015/0136447 A1* | 5/2015 | Katou | H05K 1/0218 174/251 |

* cited by examiner

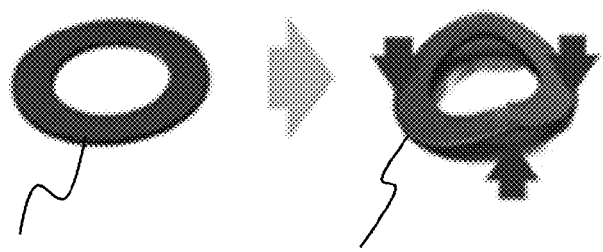
Fig. 9    87    87'
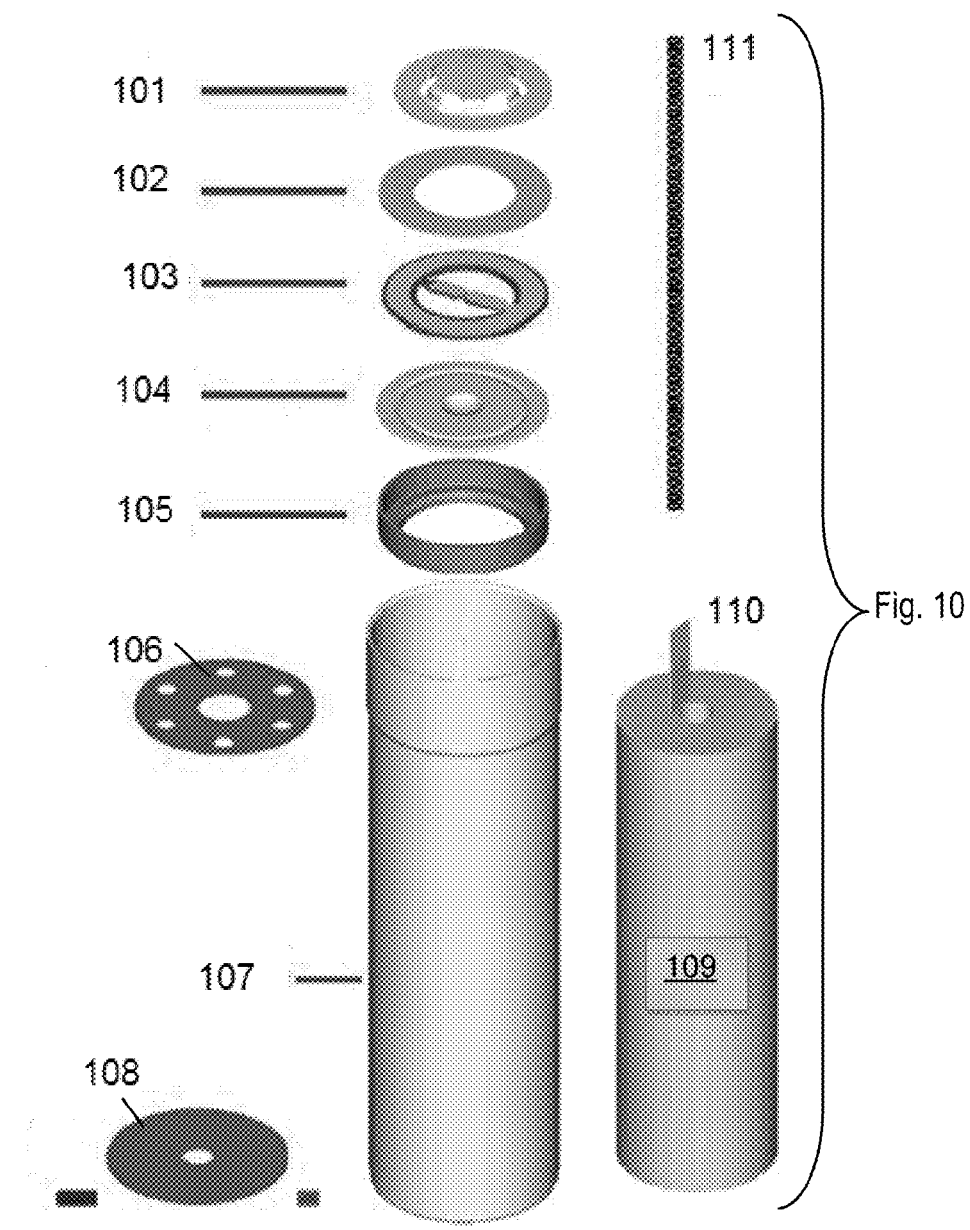
Fig. 10

COPPER FOIL AND METHODS OF USE

FIELD OF THE DISCLOSURE

The present disclosure relates to an improved copper foil with copper nodules on the matte side of the copper foil. A smooth nickel plating is formed over both the shiny side, as well as the matte side and copper nodules of the copper foil. Nickel nodules are formed in direct contact with the nickel plating on the matte side of the copper foil. The foils of the instant disclosure are useful in making a Positive Temperature Coefficient (PTC) device. Such PTC devices can be used as a resettable fuse. Particular articles in which the PTC fuse is used includes batteries, computer, mobile telephone, AC power supplies, an AC/DC power adapter, automotive, portable digital assistant (PDA), portable multi-media player, MP3 player, game console, USB, HUB, medical equipment, industrial controls and other electrical and electronic devices and systems. Methods for manufacturing the copper foil; the PPTC devices; the resettable fuses; and the use of such in useful articles is also disclosed.

BACKGROUND

A typical device for manufacturing an electrolytic copper foil comprises a metal cathode drum and an insoluble metal anode, the metal cathode drum being rotatable and having a mirror polished surface. The insoluble metal anode is arranged at approximately the lower half of the metal cathode drum and surrounds the metal cathode drum. A copper foil is continuously manufactured with the device by flowing a copper electrolytic solution between the cathode drum and the anode, applying an electrical current between these to allow copper to be electrodeposited on the cathode drum, and detaching an electrodeposited copper from the cathode drum when a predetermined thickness is obtained.

The copper foil so produced has a shiny side (the surface of the copper foil formed on the cathode drum) and a matte side (the surface of the copper foil in contact with the copper electrolytic solution) which is on the surface of the copper foil opposite the shiny side. Copper foils so produced have many uses, such as in batteries, especially rechargeable or secondary batteries and as components of printed circuit boards (PCB).

However, in the present disclosure, the electrolytically deposited copper foil is subjected to various additional treatments to produce novel copper foils having specialized purposes.

SUMMARY OF THE DISCLOSURE

The instant disclosure relates to improved copper foil that can be plated with a smooth nickel coating. However, before the nickel layer is plated on the copper foil, the matte side of the copper foil is provided with nodules of copper. Thus, the nodules of copper will exist between the copper foil and the smooth nickel coating. After the nickel coating is formed on the copper nodule containing nickel plated copper foil, nickel nodules are formed on the smooth nickel plating. A scanning electron microscope (SEM) series of photographs appear in FIG. 1 to illustrate the surfaces of the various stages of formation of the copper foil of the disclosure.

The copper foil of the instant disclosure exhibits surprising properties. When used in forming a PTC, it has been found that the shiny side of the copper foil must exhibit a Vickers hardness value of 50 to 200, or in some cases, at least 100. Furthermore, the Tensile Strength of the copper foil must be greater than 45 kg/mm$^2$. Thus, the Tensile Strength of the copper foils of the disclosure, together with the surface hardness are critical features of the inventive copper foils.

Once the copper foils of the disclosure are formed with the various nodules and platings, the inventive copper foils can be formed into a PTC device. A PTC device comprises opposed electrically conductive elements between which is placed, in contact with the opposed electrically conductive elements, an electrically non-conductive crystalline organic polymer matrix that is loaded with carbon black particles to make it electrically conductive. While cool, the polymer in a crystalline state, with the carbon black forced into the regions between crystals, forming many conductive pathways or links. As the device heats, the polymer will expand, changing from a crystalline into an expanded state. The expansion separates the carbon particles and breaks the conductive pathways, causing the resistance of the device to increase. This increase in resistance substantially reduces the current in the circuit employing the PTC device. When power is removed, the heating due to the current flowing through the PTC will stop and the PTC device will cool. As the PTC device cools, it regains its original crystalline structure and returns to a low resistance state where it can hold the current as specified for the device.

In forming the PTC device, the opposed electrically conducting elements may be soldered to leads of nickel. If the opposed electrically conductive elements are formed of copper foil, the copper will migrate into the solder, changing the composition of the solder, causing the nickel lead to easily peel from the copper foil. Thus, in the construction of PTC devices according to the disclosure, the shiny side of the copper foil is also plated with a smooth layer of nickel, such that there is no copper directly in contact with the solder and nickel lead. In the present disclosure the nickel content on the shiny side of the copper foil is in the range of about 10,000 to about 80,000 µg/dm$^2$. Conversely the nickel content on the matte side of the copper foil is in the range of about 100,000 to about 300,000 µg/dm$^2$. If the nickel content on the matte side is lower than 100,000 µg/dm$^2$, the stability of the PTC device can be comprised due to the copper migrating to the crystalline polymer/carbon black layer.

In the manufacturing of the PTC devices, the opposing copper foils of the disclosure are positioned with the matte side of the copper foils containing the nickel nodules facing each other and a composition of the carbon black filled crystalline polymer is positioned between the opposing foils to form a sandwich, which sandwich is consolidated in a hot press under elevated temperature and pressure. Once formed and cooled, the sandwich may be slit, cut, punched, or otherwise formed into the desired PTC devices. The sandwich may be captured on a rewinder immediately after forming of the consolidated sandwich for storage and/or shipping to a location for ultimate slitting, punching, etc.

BRIEF DESCRIPTION OF THE DRAWINGS

Implementations of the present technology will now be described, by way of example only, with reference to the attached figures, wherein:

FIG. 9 illustrates the case where the tensile strength is below 45 kg/mm$^2$, resulting in deformation of the PTC device; and, FIG. 10 shows the use of a PTC device in a typical secondary battery.

Figure 1:
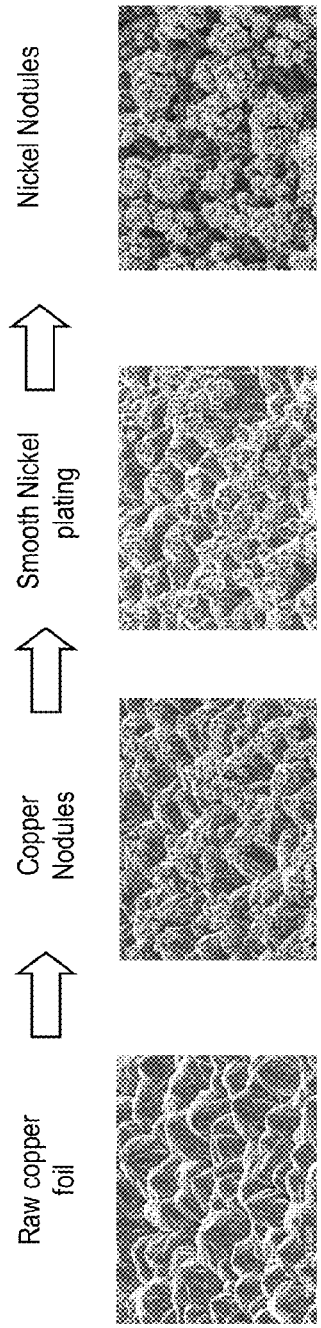
FIG. 1 is a series of SEM microphotographs showing the surface of the copper foil during manufacture and subsequent processing, including nickel plating.

It should be understood that the various aspects are not limited to the arrangements and instrumentality shown in the drawings.

DETAILED DESCRIPTION

The copper foil of the instant disclosure typically has:

(a) a shiny side with a surface roughness (Rz) is less than 2.0 μm;

(b) a matte side with a surface roughness (Rz) in the range of 6 to 10 μm; and (c) a Vickers hardness value from 50 to 200.

Unless otherwise indicated in the application, surface hardness is expressed through the specification and claims as Vickers hardness. Vickers hardness are sometimes denoted by the symbol "HV."

In some cases, the copper foil has a shiny side with a surface roughness in the range of 0.6 to less than 2.0 μm or 1.4 to less than about 2.0 μm; and/or a matte side with a surface roughness in the range of 6 to 10 μm. The roughness of the shiny side may be from about 0.6, 0.7, 0.8, 0.9, 1.0, 1.1, 1.2, 1.3, 1.4, 1.5, 1.6, 1.7, 1.8, or 1.9 μm to less than about 2.0 μm. Likewise, the roughness of the matte side may be from 6, 7, 8, 9 μm to about 10 μm or from about 6 to 7, 8, 9, or 10 μm. Finally, the Vickers hardness values are often greater than 100. Likewise, the surface hardness may be from 75 to 150, from 85 to 125, from 95, to 115. In some cases the Vickers hardness values are at least 100 to 115, 120, 125, 130, 135, 140, 145, or 150.

The nickel content of the matte side of the copper foil may be in the range of 85,000 μg/dm$^2$ to 325,000 μg/dm$^2$, of 100,000 μg/dm$^2$ to 300,000 μg/dm$^2$, of 110,000 μg/dm$^2$ to 250,000 μg/dm$^2$, or of 125,000 μg/dm$^2$ to 200,000 μg/dm$^2$. The nickel content of the shiny side of the copper foil may be in the range of 7,500 μg/dm$^2$ to 85,000 μg/dm$^2$, 8,000 μg/dm$^2$ to 80,000 μg/dm$^2$, of 15,000 μg/dm$^2$ to 75,000 μg/dm$^2$, or of 20,000 μg/dm$^2$ to 70,000 μg/dm$^2$.

In some cases, the tensile strength remains at or above 45 kg/mm$^2$ or 46, 48, 50, 52, 54, 56, 58, or 60 kg/mm$^2$ at room temperature and be as high as 65, 70, 75, 80, 85, 90, or 100 kg/mm$^2$.

The thickness of the copper foil may be from about 7 μm, 8 μm, 9 μm, or 10 μm, 20 μm, 30 μm to about 40 μm, 50 μm, 60 μm, 70 μm, 80 μm, 90 μm or 100 μm; from about 7 μm, 8 μm, 9 μm, or 10 μm to about 20 μm, 25 μm, 30 μm, 35 μm, 40 μm, or 45 μm; or from about 10 μm, 15 μm, 16 μm, 17 μm, 18 μm, 19 μm, 20 μm to about 70 μm, 71 μm, 72 μm, 73 μm, 74 μm, or 75 μm. Likewise, the copper foil may be about 7 μm, 8 μm, 9 μm, 10 μm, 11 μm, 12 μm, 13 μm, 14 μm, 15 μm, 20 μm, 25 μm, 30 μm, 35 μm, 40 μm, 45 μm, 50 μm, 55 μm, 60 μm, 65 μm, or 70 μm thick.

A series of SEM photomicrographs in FIG. 1 are illustrative of the surface texture at various steps of the formation of the nickel plated copper foil.

In some cases, the tensile strength remains at or above 45 kg/mm$^2$ or 46, 48, 50, 52, 54, 56, 58, or 60 kg/mm$^2$ at room temperature after electrolytic deposition and even after cooling to room temperature several days later. However, the copper foil must have a tensile strength of at least 45 kg/mm$^2$. If the copper foil does not possess this tensile strength, the PTC devices are subject to deformation making the PTC too difficult to assemble in a battery or other types of electronic devices.

Figure 2:
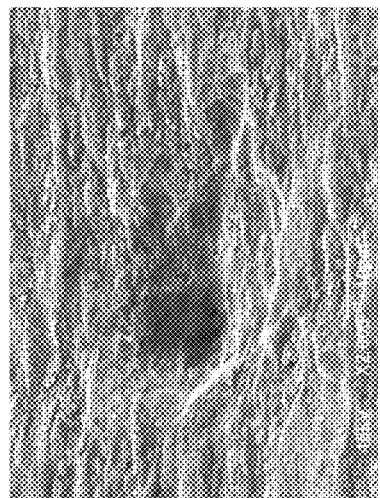
FIG. 2 is a SEM microphotograph showing the creation of a pit in the surface of a nickel-plated copper foil formed during hot pressing of a PTC sandwich, especially when the Vickers hardness value is below 100.

If the Vickers hardness is too low, the surface of the PTC device may develop pits (as shown in the SEM of FIG. 2) when the PTC sandwich is hot pressed. Furthermore, if the surface roughness (Rz) is greater than about 2.0 μm, the surface of adjacent PTC devices may cause scratches in one or more of their surfaces.

Still further, if the matte side surface roughness (Rz) is less than 6 μm, peel strength is not sufficient to prevent delamination. On the other hand, should the matte side surface roughness (Rz) exceed 10 μm, the crystalline polymer/carbon black mixture is unable to completely fill thereby forming a void. After the soldering/welding process, the PTC will delaminate at the foil/crystalline polymer interface.

Figure 3:
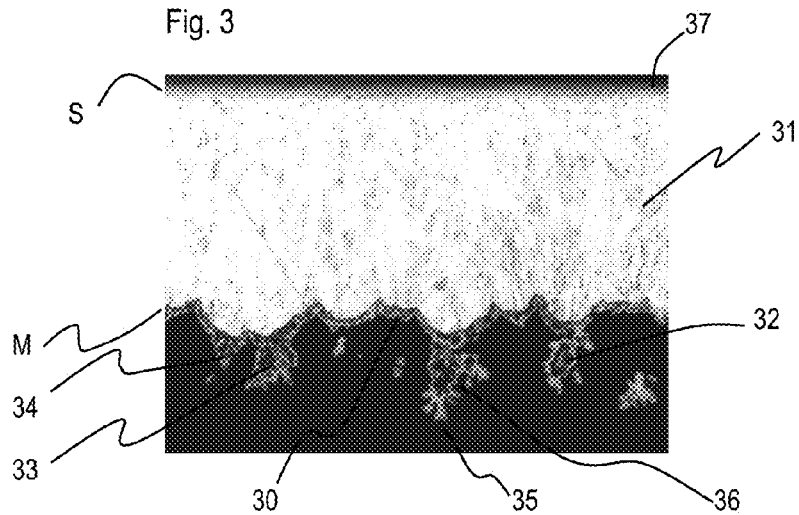
FIG. 3 is a schematic illustration of the nickel plated copper foil according to the present disclosure.

FIG. 3 is a schematic illustration of the nickel plated copper foil according to the present disclosure, wherein 31 is the base copper foil having a shiny side S, and a matter side M. A thin smooth layer of nickel plating 37 can be seen adjacent the shiny side S, and copper nodules 32, 33, 34 can be seen adjacent the matte side M. Smooth nickel plating 36, 30 covers both the matte side M and the copper nodules 32, 33, 34. Nickel nodule 35 is also visible.

Figure 4:
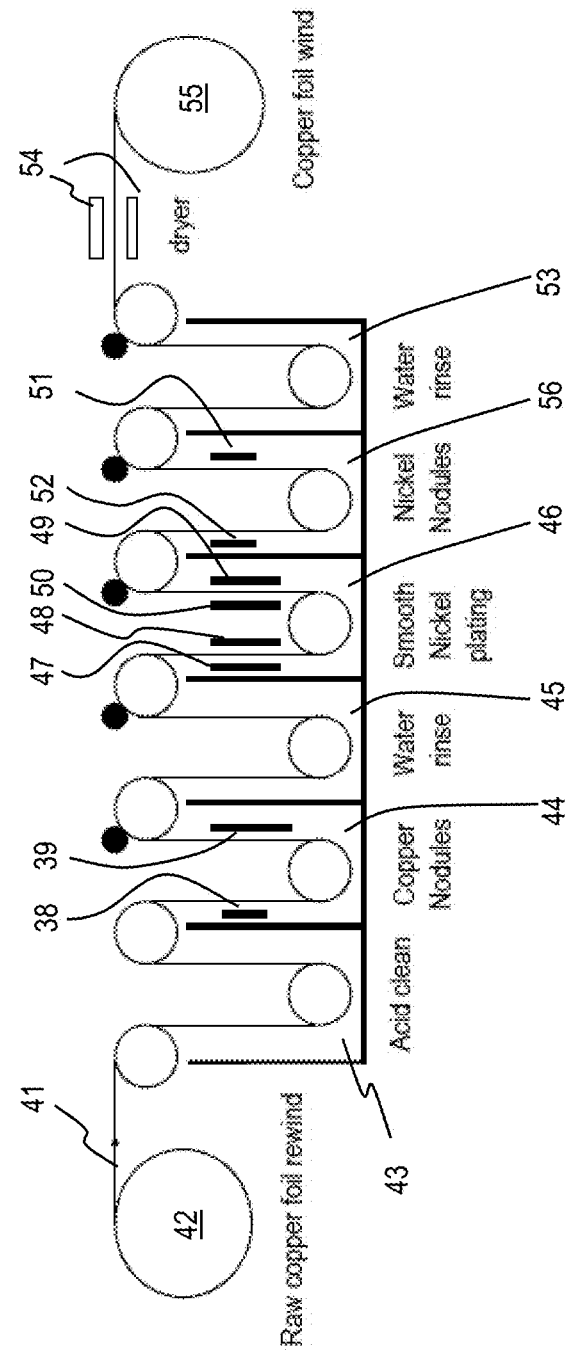
FIG. 4 is a schematic manufacturing process for forming the copper foil according to the present disclosure.

FIG. 4 is a schematic manufacturing process for forming the copper foil according to the present disclosure, in which an electrolytically deposited copper foil 41, is unwound from a roll of copper foil 42, and passed into an acid cleaning bath 43, after which copper nodules are formed on the foil in bath 44. Electrodes 38, 39 control the formation of the copper nodules to the matte side M of the copper foil 41. After a water rinse in bath 45, a smooth nickel plating occurs on both the shiny S and matte M sides of the copper foil in bath 46. Here, electrodes 47, 48, 49, 50 plate the nickel on both the shiny side S and matte side M of copper foil 41. Nickel nodules are then formed on matte side M of foil 41 by the selective use of the electrodes 51 and 52 in plating bath 56. After a subsequent water rinse in bath 53, the plated foil is passed through a dryer 54 and rewound to form roll 55.

Figure 5:
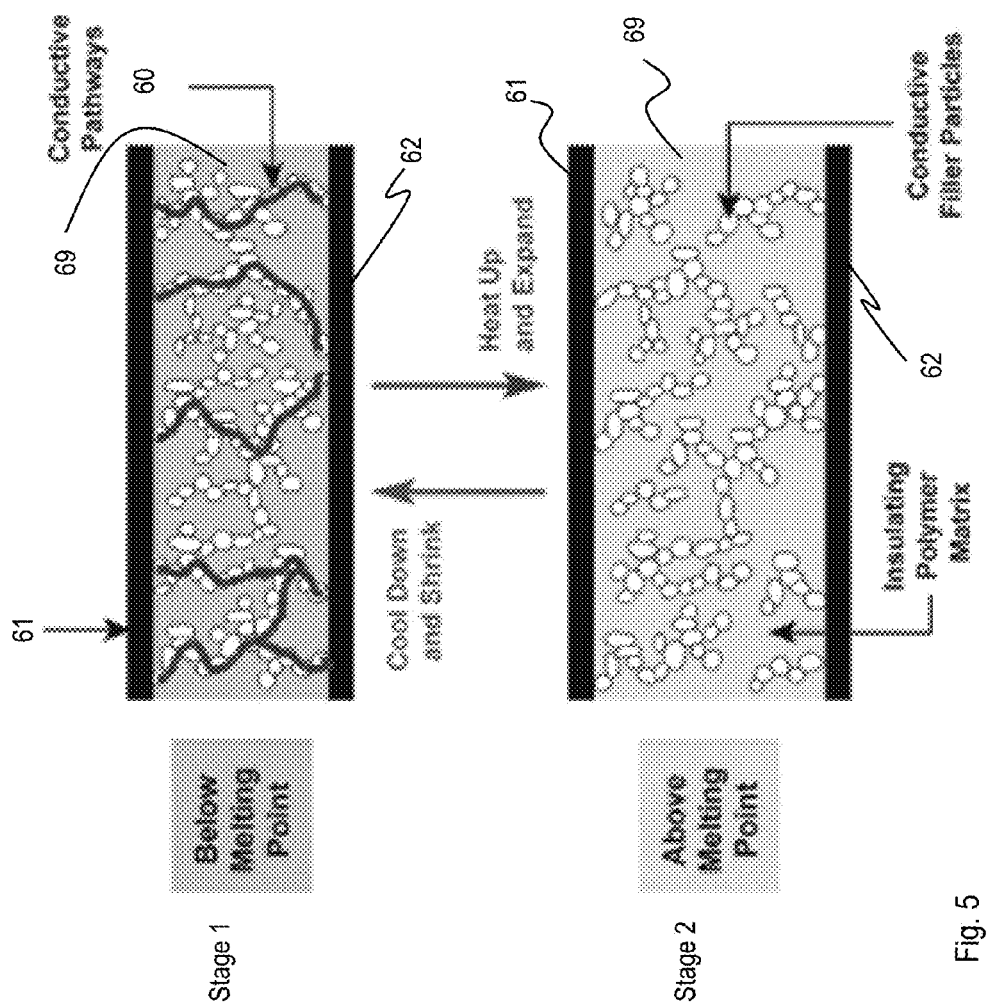
FIG. 5 is a schematic, cross-sectional view of a PTC device according to the disclosure toggling between the conductive and non-conductive states depending on temperature cycles.

FIG. 5 is a schematic, cross-sectional view of a PTC device according to the disclosure toggling between the conductive and non-conductive states depending on temperature cycles. The crystalline polymer/carbon black mixture 69 is located between opposing nickel plated copper foils as illustrated in two different states. In state 1, a cool (below melting point of the crystalline polymer) the carbon black forms "chains" (pathways or links) 60 bridging the opposed nickel plated copper foils 61, 62 thereby providing an electrically conducting path through the non-conductive crystalline polymer. In state 2, the crystalline polymer heats up into an expanded state where the polymer is expanded (softened), thereby freeing up the carbon black and "breaking the chains" (pathways or links) of the carbon black between opposed foils 61, 62.

Figure 6:
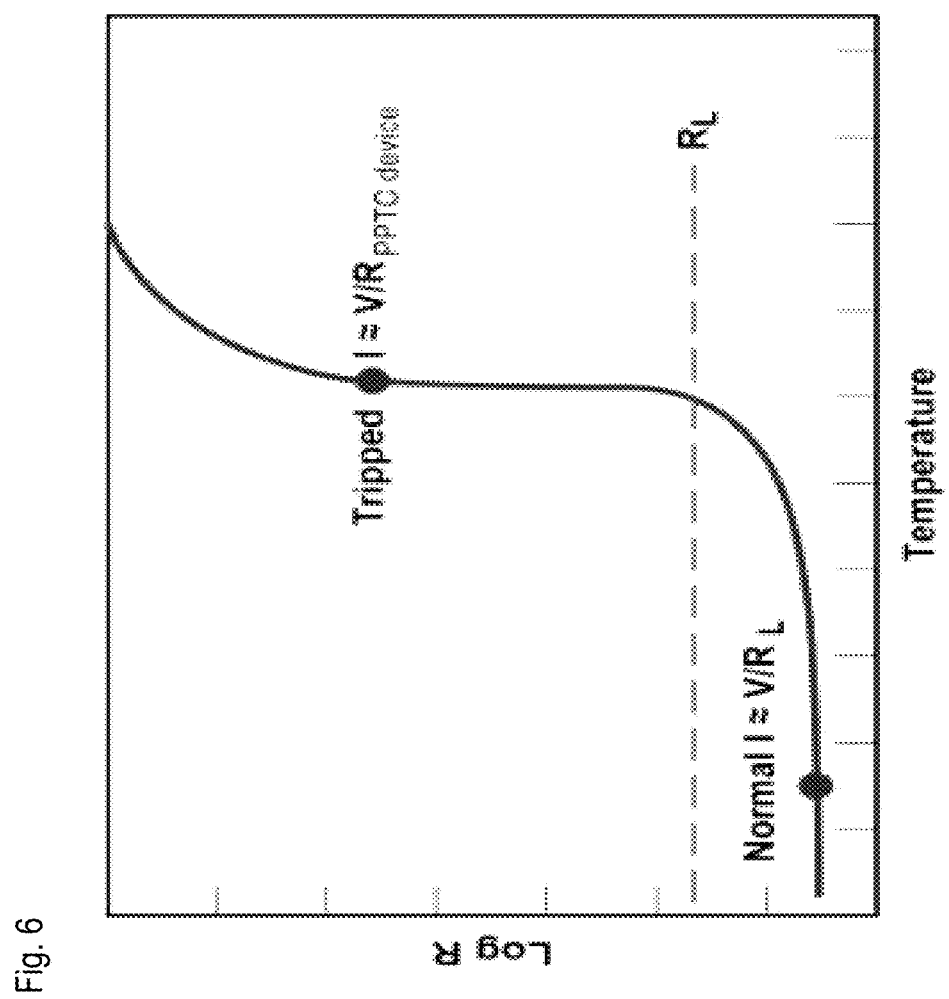
FIG. 6 is a graphic illustration of the electrical conduction and tripping of a PTC device according to the disclosure.

A graphical representation of temperature versus conductivity is shown in FIG. 6 for a typical PTC device according to the disclosure, although it is evident that the relationship between temperature and conductivity can be tailored by altering the specific non-conductive polymer, or by using polymer blends, by the loading of the carbon black, by the thickness of the PTC device, and by combinations thereof.

Figure 7A:
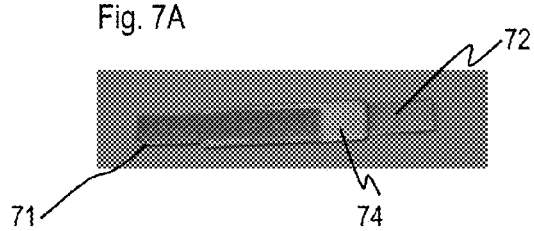
FIG. 7A is a schematic representation of strap type PTC devices with nickel leads.
Figure 7B:
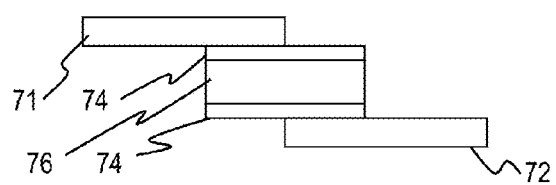
FIG. 7B is a cross-sectional view of FIG. 7A.

FIG. 7A is a schematic representation of strap type PTC devices with strap type nickel leads 71, 72 soldered to the nickel plated shiny side S of the copper foils 74 of the disclosure and FIG. 7B is a cross sectional view of FIG. 7A. The crystalline polymer/carbon black mixture 76 is located between opposing nickel plated copper foils 74.

Figure 8:
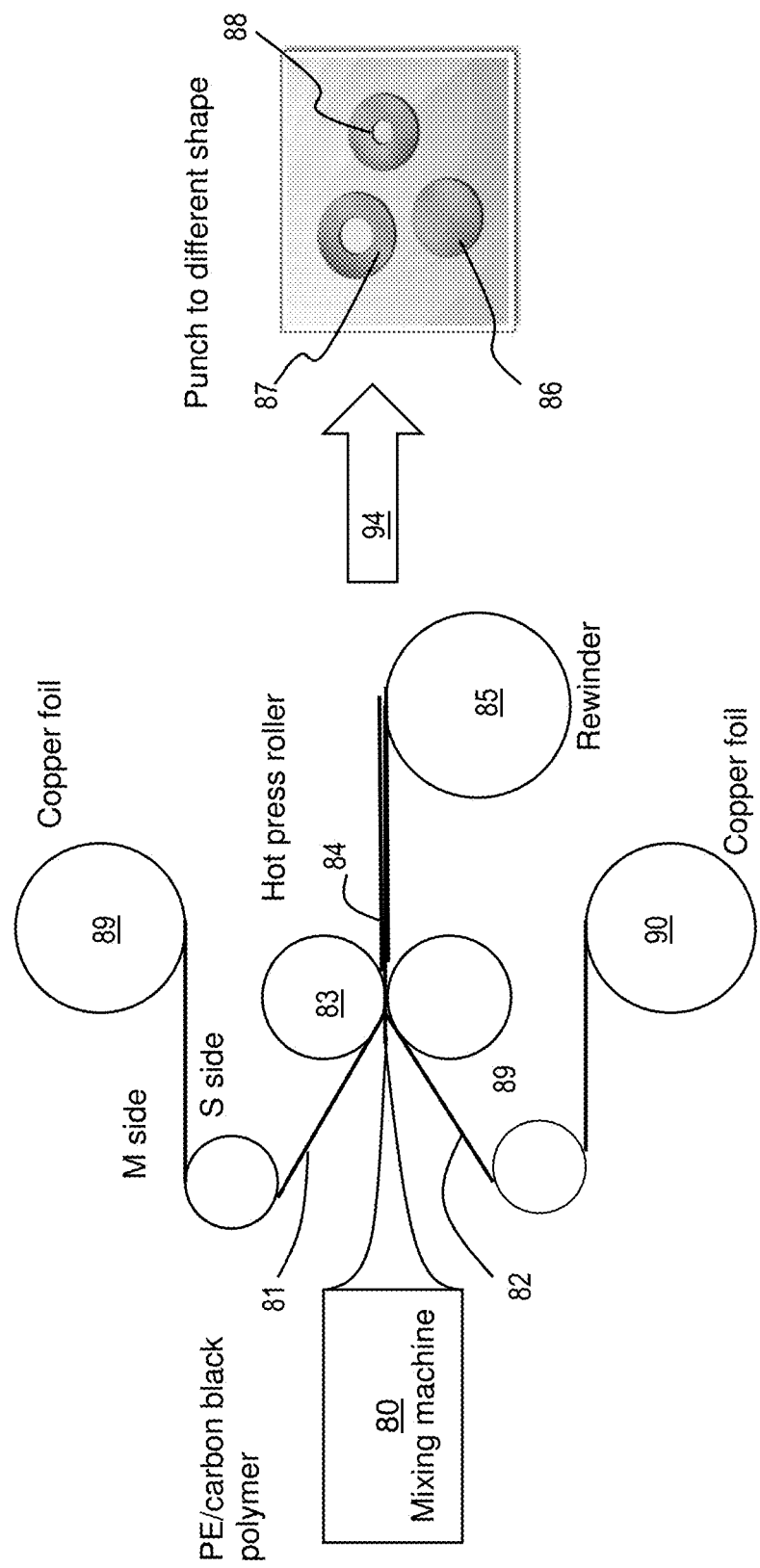
FIG. 8 is a schematic representation of a hot press formation of a sandwich of a PTC device, including the punching or severing of individual PTC devices from the sandwich.

FIG. 8 is a schematic representation of a hot press formation of a sandwich of a PTC device, including the punching or severing of individual PTC devices from the sandwich in which a crystalline non-conductive polymer/carbon black mixture 80 is delivered between the matte side M of opposing nickel plated copper foils 81, 82 retried from source rolls 89, 90, respectively, of copper foil according to the disclosure fed to the nip of a hot press roller 83 to consolidate the sandwich 84 of foils and carbon filled non-conductive polymer which can be received on a rewinder 85 for storage and/or shipping. Alternatively the sandwich 94 can be directly severed, cut or punched to form different shapes of PTC devices, including disk 86, or differently dimensioned washer shapes 87, 88.

FIG. 9 illustrates the case where the tensile strength is below 45 kg/mm$^2$, resulting in deformation of the PTC device 87 into deformed PTC device 87'. A deformed PTC device 87' may be difficult or impossible to assemble into combination with a secondary battery, a power source, a multi-media or MP 3 player or other electrical or electronic device.

Lastly, FIG. 10 shows the use of a PTC device in a typical secondary battery, where the PTC device 102 is placed between cap 101 and a current interrupt device 103. Vent 104, gasket 105 and top insulator 106 fit with can 107. A bottom separator 108 is positioned between the so-called "jelly roll" or wound positive/negative separator 109 and tab 110 which are also located in can 107. An optional gas channel or center pin 111 provide for abnormal condition in some secondary batteries.

The PTC devices comprising the copper foils of the instant disclosure are useful in batteries, electronic devices comprising the batteries, and/or in the electronic devices themselves (not in the battery). For example, the PTC device comprising the copper foil may be used in electronic devices such as mobile telephones, AC/DC adapters; AC power supplies, computers, multimedia or MP3 players, game consoles, industrial controls, USB, HUB, automobiles, electric vehicles including electric automobiles, tablets, laptops and notebooks, personal digital assistants (PDA) and medical equipment, as well as other portable electronic devices.

EXAMPLE 1

Manufacture of Electrolytic Copper Foil

Copper wires were dissolved in a 50 wt % sulfuric acid aqueous solution to prepare a copper sulfate electrolyte containing 320 WI of copper sulfate ($CuSO_4.5H_2O$) and 100 g/l of sulfuric acid. To per liter of the copper sulfate electrolyte 0.35 mg of gelatin (DV: Nippi Company), and 2.0 mg chloride ion were added. Subsequently, an electrolytic copper foil with thickness of 35 μm is prepared at a liquid temperature of 55° C. and current density of 70 A/dm$^2$.

Copper Nodule Treatment of the Matte Side of Electrolytic Copper Foil

Copper nodules were formed on the matte side of the copper foil utilizing the following materials and parameters of temperature, current density and time:
Copper Sulfate ($CuSO_4.5H_2O$): 120 g/l
Sulfuric Acid ($H_2SO_4$): 100 g/l
Chloride Ion: 3.5 ppm
Temperature: 25° C.
Current Density: 40 A/dm$^2$
Time: 3.5 Sec Smooth Nickel Plating Over the Matte Side of the Copper Foil and the Copper Nodules A smooth nickel plating was formed on the matte side of the copper foil and copper nodules utilizing the following materials and parameters of temperature, current density and time:
Nickel sulfate ($NiSO_4.7H_2O$): 300 g/l
Boric Acid ($H_3BO_3$): 40 g/l
Temperature: 50° C.
Current density: 10 A/dm$^2$
Time: 30 Sec The color L* of the matte side of the nickel-plated copper foil may be in the range of 30 to 60, preferably in the range of 35 to 50, and more preferably in the range of 40 to 45. If the matte side L* is less than 30, it means that the nodule treatment is too much, and the nodule is easily broken after hot pressing, resulting in a small peeling strength which is not sufficient to prevent delamination. If the matte side L* is larger than 60, it means the nodule treatment is too little, the surface area is too small, and the resultant peel strength is too low, which is also not sufficient to prevent delamination.

Nickel Nodule Plating on Smooth Nickel Plating Layer of Matte Side

Nickel nodules were formed by plating on the smooth nickel plating layer of the matte side of the copper foil utilizing the following materials and parameters of temperature, current density and time:
Nickel sulfate ($NiSO_4.7H_2O$): 70 g/l
Ammonium sulfate (($NH_4)_2SO_4$): 30 g/l
Temperature: 30° C.
Current density: 35 A/dm$^2$
Time: 10 Sec Smooth Nickel Plating on Shiny Side of the Copper Foil A smooth nickel plating was formed on the shiny side of the copper foil utilizing the following materials and parameters of temperature, current density and time:
Nickel sulfate ($NiSO_4.7H_2O$): 300 g/l
Boric Acid ($H_3BO_3$): 40 g/l
Temperature: 50° C.
Current density: 8 A/dm$^2$
Time: 5 Sec The properties were measured for all Examples and Comparative Examples according to the following testing methods.

TEST METHODS

Tensile Strength: Tensile strength is the maximum stress that a material can withstand while being stretched or pulled before failing or breaking. Tensile strength is not the same as compressive strength and the values can be quite different. Tensile strength was measured according to IPC-TM-650. The electrolytic copper foil was cut to obtain a test sample in the size of 100 mm×12.7 mm (length×width). The test sample was measured at room temperature (about 25° C.) under the conditions of a chuck distance of 50 mm and a crosshead speed of 50 mm/min by using Model AG-I testing machine of Shimadzu Corporation.

Elongation: Based on the method of IPC-TM-650, the electrolytic copper foil was cut to obtain a test sample with the size of 100 mm×12.7 mm (length×width), and the test sample was measured at room temperature (about 25° C.) under the conditions of a chuck distance of 50 mm and a crosshead speed of 50 mm/min by using Model AG-I testing machine of Shimadzu Corporation.

Surface Roughness: Roughness was measured using according to JIS B 0601-1994 using an α-type surface roughness measuring instrument (Kosaka Laboratory Ltd; SE 1700 Series).

Color L* of Matte (M) Side: The color L* of M side measurements were conducted based on the method of JIS Z 8722 (2000) using a spectrophotometer (Konica Minolta; CM2500c) ("Methods of color measurement-Reflecting and transmitting objects").

Nickel Content: The Nickel content was determined by cutting the copper foil to a size of 150×150 mm and placing a protective coating on one side of the copper foil (the coating prevents the copper foil from dissolving). After drying, the specimen was further cut into a size of 100×100 mm (area=1 dm$^2$). The specimens were then put into a dish and dissolved with 20 ml of 18% HCl solution and 3 ml of 30% $H_2O_2$ solution. After the nickel on the surface of copper foil was dissolved completely, the solution was poured into a 50 ml volumetric flask. The dish was rinsed with water to reach the final volume. The amount of Nickel was measured according to ICP-AES.

Hardness Test: Equipment and Apparatus: Microhardness tester—Future-tech Corp. Model: FM-7. Method is based on the method of ISO-6507-1:2005 Metallic materials-Vickers hardness test-Part 1.

Peel strength test: A batch mixer is set at 160° C., and crystalline polymer and conductive filler are added and mixed at 50 rpm for 15 minutes to form PTC material. The crystalline polymer comprises HDPE (High density polyethylene) of 22.1 wt. % and Ethylene/butyl acrylate copolymer of 27.6 wt. %, and the conductive filler is carbon black of 50.3 wt. %. The PTC material is then put into a hot presser. A steel plate and a polytetrafluoroethylene (TEFLON®) mold-release cloth are disposed at top and bottom surfaces of the PTC material, so as to form a PTC conductive layer by pressing at 180° C. Sequentially, two copper foils are disposed at top and bottom surfaces of the PTC conductive layer, and the combination is pressed to form a PTC composite material (i.e., a structure of copper foil/PTC conductive layer/copper foil). The peel strength was measured by cutting samples with dimensions of 25×125 mm from PTC composite material. One end of the sample was clamped into a Model AG-I testing machine of Shimadzu Corporation tester. At the other end, the copper foil was peeled away from the PTC conductive polymer layer at an angle of 90° and at a rate of 50 mm/minute. The amount of force in kg/cm required to remove the copper foil from the conductive polymer layer was recorded.

Bending test: FTC composite material (i.e., a structure of copper foil/PTC conductive layer/copper foil) was punched to washer shape. The PTC composite washer was supported at its outer diameter on two anvils and a flat plate was pressed across its center, midway between the supporting anvils, to bend the washer. The amount of force in kgf required to bend the washer shape PTC composite material was recorded. The larger the force means the more difficult to deform the FTC composite washer.

Delamination test: A batch mixer is set at 160° C., and crystalline polymer and conductive filler are added and mixed at 50 rpm for 15 minutes to form PTC material. The crystalline polymer comprises HDPE (High density polyethylene) of 22.1 wt. % and Ethylene/butyl acrylate copolymer of 27.6 wt. %, and the conductive filler is carbon black of 50.3 wt. %. The PTC material is then put into a hot presser. A steel plate and a polytetrafluoroethylene (TEFLON®) mold-release cloth are disposed at top and bottom surfaces of the PTC material, so as to form a FTC conductive layer by pressing at 180° C. Sequentially, two copper foils are disposed at top and bottom surfaces of the PTC conductive layer, and the combination is pressed to form a PTC composite material (i.e., a structure of copper foil/PTC conductive layer/copper foil). The PTC composite material was punched into a plurality of chips of around 10 mm×10 mm. The chips were immersed in 270° C. solder for 30 Sec, then use fingers to peel the copper foil to see if the copper foil delaminates from PTC conductive layer.

Soldering peel test: The PTC composite material was punched into a plurality of chips of around 10 mm×10 mm. Two sides of the chips were soldered to an iron lead. Then the chip was clipped by pliers, if the chip peels off at the solder interface, it means the nickel thickness of the S side of the copper foil is too thin, because after the soldering process, copper migrates to the solder and changes the composition of the solder. If the chip peels off in the PTC polymer, the nickel thickness on the S side of the copper foil is acceptable.

EXAMPLES 2-6

Examples 2-6 were prepared in the same manner as Example 1.

The foregoing copper foils of Examples 2-6 were treated to form copper nodules on the matte side of the copper foil in the same manner as in Example 1.

Both the matte side and shiny side of the copper foil were then plated with a smooth layer of nickel in the same manner as in Example 1. The nickel content on the shiny side of the copper foil of Examples 1-6 resulted in a nickel content of within 10,000 to about 80,0000 μg/dm$^2$. The nickel content on the matte side of the copper foil resulted in a nickel content of within about 100,000 to about 300,0000 μg/dm$^2$ for each of the foregoing Examples.

The products of Examples 1-6 were measured and tested and the results are set forth in TABLE 1.

TABLE 1

| Example | 1 | 2 | 3 | 4 | 5 | 6 |
|---|---|---|---|---|---|---|
| Thickness (μm) | 35 | 35 | 35 | 35 | 35 | 35 |
| Tensile strength (kg/mm$^2$) | 45.2 | 46.4 | 62.9 | 55.2 | 64.7 | 60.2 |
| Elongation (%) | 14.9 | 12.8 | 10.2 | 11.6 | 12.5 | 10.6 |
| S side Rz (μm) | 1.05 | 0.62 | 1.12 | 1.98 | 1.56 | 1.67 |
| M side Rz (μm) | 6.15 | 6.02 | 6.25 | 7.26 | 9.98 | 8.03 |
| Ni content of S Side (μg/dm$^2$) | 10,852 | 12,256 | 60,034 | 42,326 | 80,825 | 51,698 |
| Ni content of M Side (μg/dm$^2$) | 100,231 | 106,570 | 109,052 | 212,563 | 102,368 | 300,672 |
| M side L* | 31,25 | 59.20 | 42.53 | 38.61 | 34.30 | 46.5 |
| Hardness of S side (HV) | 52 | 61 | 189 | 116 | 202 | 174 |
| Peel strength (kg/cm) | 1.98 | 1.77 | 1.82 | 2.05 | 2.11 | 2.06 |
| Delamination test** | OK | OK | OK | OK | OK | OK |
| Soldering peel test** | OK | OK | OK | OK | OK | OK |
| Bending test (kgf) | 1.21 | 1.23 | 1.48 | 1.31 | 1.45 | 1.39 |
| Pits & scratch defect (%) | 0.71 | 0.38 | 0.20 | 0.35 | 0.18 | 0.21 |

COMPARATIVE EXAMPLES 1-7

Comparative Examples 1-7 were prepared with the measurement and test results set forth in TABLE 2.

TABLE 2

| Comparative Example | 1 | 2 | 3 | 4 | 5 | 6 | 7 |
|---|---|---|---|---|---|---|---|
| Thickness (μm) | 35 | 35 | 35 | 35 | 35 | 35 | 35 |
| Tensile strength (kg/mm$^2$) | 34.7 | 45.8 | 46.2 | 55.2 | 54.3 | 46.8 | 61.3 |
| Elongation (%) | 15.6 | 12.5 | 11.6 | 10.6 | 11.5 | 10.9 | 10.5 |
| S side Rz (μm) | 1.25 | 1.76 | 1.26 | 2.51 | 1.56 | 1.37 | 1.48 |
| M side Rz (μm) | 6.54 | 7.25 | 11.89 | 6.76 | 6.15 | 6.27 | 4.25 |
| Ni content of S Side (μg/dm$^2$) | 12,026 | 8,256 | 12,500 | 13,025 | 12.354 | 11,985 | 72,854 |
| Ni content of M Side (μg/dm$^2$) | 103,485 | 5,364 | 128,632 | 119,536 | 115,304 | 112,053 | 115367 |
| M side L* | 41.30 | 37.62 | 39.26 | 38.25 | 65.23 | 25.35 | 36.72 |
| Hardness of S side (HV) | 41 | 56 | 59 | 78 | 76 | 62 | 182 |
| Peel strength (kg/cm) | 1.86 | 1.92 | 2.15 | 1.91 | 1.35 | 1.52 | 1.36 |
| Delamination test** | OK | OK | NG | OK | NG | NG | NG |
| Soldering peel test** | OK | NG | OK | OK | OK | OK | OK |
| Bending test (kgf) | 0.98 | 1.22 | 1.23 | 1.32 | 1.30 | 1.34 | 1.28 |
| Pits & scratch defect | 4.65 | 0.88 | 0.61 | 5.52 | 0.52 | 0.48 | 0.19 |

*In the foregoing TABLE 1 and TABLE 2, the color L* of M side measurements were conducted based on the method of JIS Z 8722 (2000) discussed above.
**In the foregoing TABLE 1 and TABLE 2, the acronym "NG" means "no" good and the acronym "OK" means "acceptable."

The above embodiments are only used to illustrate the principle of the present disclosure and the effect thereof, and should not be construed as to limit the present disclosure. The above embodiments can be modified and altered by those skilled in the art, without departing from the spirit and scope of the present disclosure. Therefore, the protection scope of the present disclosure is defined in the following appended claims. As long as it does not affect the effects and achievable goals of this disclosure, it should be covered under the technical contents disclosed herein.

The terms "comprising," "having," and "including" are used in their open, non-limiting sense. The terms "a" and "the" are understood to encompass the plural as well as the singular. The expression "at least one" means one or more and thus includes individual components as well as mixtures/combinations. The term "about" when referring to a value, is meant specifically that a measurement can be rounded to the value using a standard convention for rounding numbers. For example, "about 1.5" is 1.45 to 1.54. All valued set forth herein can be modified with the term "about" or recited without the term, regardless of whether the term "about" is specifically set forth in conjunction with any particular value. All ranges and values disclosed herein are inclusive and combinable. For examples, any value or point described herein that falls within a range described herein can serve as a minimum or maximum value to derive a sub-range, etc.

We claim:

1. A nickel-plated copper foil comprising:
   an electrodeposited foil of copper, the foil having a shiny side and a matte side;
   the matte side of the copper foil having copper nodules in direct contact with the matte side of the copper foil; a nickel plating over the matte side of the copper foil and the copper nodules in direct contact with the copper foil; and,
   nickel nodules in direct contact with said nickel plating; wherein the nickel content on the matte side of the copper foil being in the range of 100,000-300,000 μg/dm$^2$.

2. The nickel-plated copper foil of claim 1, wherein the shiny side of the copper foil has a surface roughness (Rz) of less than 2.0 μm.

3. The nickel-plated copper foil of claim 1, wherein the surface hardness of the shiny side of the copper foil is from 50 to 200.

4. The nickel-plated copper foil of claim 1, wherein the matte side of the copper foil has a surface roughness (Rz) in the range of 6-10 μm.

5. The nickel-plated copper foil of claim 1, further comprising nickel on the shiny side of the copper foil; wherein the nickel content on the shiny side of the copper foil being in the range of 10,000-80,000 μg/dm$^2$.

6. The nickel-plated copper foil of claim 1, wherein the tensile strength of the copper foil is at least 45 kg/mm$^2$.

7. The nickel-plated foil of claim 1, wherein the color L* of the matte side of the copper foil is from 30 to 60.

8. A Positive Temperature Coefficient (PTC) device comprising the nickel-plated copper foil of claim 1.

9. The Positive Temperature Coefficient (PTC) device of claim 8, further comprising an electrically insulating polymer having electrically conductive filler in the polymer.

10. The Positive Temperature Coefficient (PTC) device of claim 9, further comprising a second nickel-plated copper foil positioned with the polymer and electrically conductive filler between the second nickel-plated copper foil and the matte side of the first nickel-plated copper foil.

11. The Positive Temperature Coefficient (PTC) device of claim 10, wherein the electrode is in a shape selected from the group consisting of an annular ring, a disc, a strap and a radial-leaded device.

12. The Positive Temperature Coefficient (PTC) device of claim 10, wherein the Positive Temperature Coefficient (PTC) device is a surface mount device.

13. A method of manufacturing a Positive Temperature Coefficient (PTC) device comprising the steps of:

providing two nickel-plated copper foils according to claim 1, with the matte sides of the nickel plated copper foils facing, but spaced apart from, each other;

introducing a non-electrically conducting polymer having a plurality of electrically conductive filler contained in the polymer between the two nickel-plated copper foils;

passing the two nickel-plated copper foils and the non-electrically conductive polymer having the electrically conductive filler therein through a hot press; and, consolidating the two nickel-plated copper foils and the polymer containing the electrically conductive filler into a unitary product.

14. The method of claim 13, wherein the consolidating comprises applying both heat and pressure.

15. The method of claim 13, further comprising simultaneously passing a stack of a plurality of two nickel-plated copper foils and the non-electrically conductive polymer having electrically conductive filler through the hot press.

16. The method of claim 13, further comprising punching shapes from said unitary product.

17. The method of claim 16, wherein the punched shape is positioned between a positive terminal of a secondary battery and a negative terminal of the secondary battery.

18. Resettable fuses comprising the Positive Temperature Coefficient (PTC) device of claim 10.

19. The resettable fuse of claim 18, in combination with at least one device selected from the group consisting of a computer, a mobile telephone, a battery, an AC power supply, an AC/DC power adapter, an automobile, a portable digital assistant (PDA), a portable multi-media player, an MP3 player, a game console, an USB, a HUB, an industrial control and medical equipment.

* * * * *